United States Patent [19]
Johnson et al.

[11] Patent Number: 5,540,787
[45] Date of Patent: Jul. 30, 1996

[54] METHOD OF FORMING TRINIOBIUM TIN SUPERCONDUCTOR

[75] Inventors: Neil A. Johnson, Schenectady; Melissa L. Murray, Schaghticoke; Thomas R. Raber, East Berne; Mark G. Benz, Burnt Hills, all of N.Y.

[73] Assignee: General Electric Company, Schenectady, N.Y.

[21] Appl. No.: 490,365

[22] Filed: Jun. 14, 1995

[51] Int. Cl.⁶ .................... C23C 2/08; C23C 8/80
[52] U.S. Cl. .................... 148/98; 148/277; 148/281; 427/62
[58] Field of Search .................... 148/98, 277, 281, 148/284, 537; 427/62

[56] References Cited

U.S. PATENT DOCUMENTS

| | | | |
|---|---|---|---|
| 4,105,512 | 8/1978 | Martens et al. | 148/98 |
| 4,224,087 | 9/1980 | Tachikawa et al. | 148/133 |
| 4,977,303 | 12/1990 | Briffod | 148/277 |

FOREIGN PATENT DOCUMENTS

| | | |
|---|---|---|
| 1254542 | 11/1971 | United Kingdom . |
| 2257437 | 1/1993 | United Kingdom ............ 148/98 |

OTHER PUBLICATIONS

"Enhancement of the Critical Current Density in Niobium-Tin", J. S. Caslaw, Cryogenics, Feb. 1971, pp. 57–59.

"Problems with the External Diffusion Process for Producing Nb3Sn–Cu Superconducting Wire", J. D. Verhoeven, et al., Appl. Phys. Lett. 40(1), Jan. 1982, pp. 87–88.

*Primary Examiner*—George Wyszomierski
*Attorney, Agent, or Firm*—Noreen C. Johnson; William H. Pittman

[57] ABSTRACT

The solid-liquid diffusion process used to form triniobium tin superconductor is improved by oxidizing the tin coated niobium substrate with an oxide layer on the surface of the tin coat after tin dipping. The oxide layer can be added to the tin coat by passing the tin coated niobium substrate through an oxidizing chamber before the reaction anneal step, by adding oxygen to the reaction anneal furnace with argon or helium, by adding oxygen to the cooling tower immediately after the tin dipping process, or by controlling the exit temperature of the tin coated substrate from the tin dip in room atmosphere conditions.

10 Claims, 4 Drawing Sheets

METHOD OF FORMING TRINIOBIUM TIN SUPERCONDUCTOR

FIELD OF THE INVENTION

This invention relates to a method for producing a triniobium tin superconductor by liquid-solid phase diffusion. In particular, the method to make triniobium tin superconductor utilizes an oxide surface layer on the tin coating while forming the triniobium tin superconductor.

BACKGROUND OF THE INVENTION

The intermetallic compound triniobium tin, $Nb_3Sn$, is a type-II metallic superconductor of interest because it has high values of superconducting critical current density in high magnetic fields. Critical current density, $J_c$, is a value resulting from division of the critical current measured in a magnetic field by the cross-sectional area of the superconductor.

Historically, $Nb_3Sn$ has been formed using a number of different processes. These include: 1) condensation from the vapor phase; 2) crystallization from the liquid phase; 3) diffusion between one solid phase and one liquid phase; and 4) diffusion between two solid phases. This invention is related to the solid-liquid diffusion method which is now described.

Methods for forming triniobium tin superconductors by liquid-solid diffusion require multiple steps. The general method is well known and a description of this method is given below.

Generally, the first step in forming triniobium tin superconductor is to clean the niobium or niobium based substrate, usually a wire or foil. This is done with a cleaning solution or etchant, such as a mixture of nitric acid, hydrochloric acid, and water. Diluted hydrofluoric acid is also sometimes used for cleaning the substrate. After the substrate is cleaned, oxygen may be added to the surface of the substrate by anodizing the surface electrolytically.

The next three steps involve high temperature heat treatments. The first anneal, as taught by Caslaw in British patent 1,342,726, is used to introduce a desired oxygen content into the niobium substrate. This is accomplished by passing the substrate through a furnace at about 950° C. for about 30 seconds in an atmosphere containing argon and oxygen. However, if the substrate has been previously anodized to form an oxide layer on the surface of the substrate, then the preheat is called a decomposition anneal whereby the substrate is annealed so that the oxide layer diffuses into the body of the substrate. This would be conducted in an oxygen free environment. At this point the niobium substrate may be wound in a coil until further processing or may continue to the tin dip process.

After the preheat, the substrate is dipped in a tin or tin alloy bath, which supplies the tin for the triniobium tin reaction. The operating temperature for the tin bath is between 900°–1100° C.

The tin coating from the bath has a limiting thickness due to the amount of tin needed to further react with the niobium. This thickness is about two to thirty micrometers of tin. The tin thickness is inversely proportional to the viscosity of the tin bath and the temperature of the tin bath, and proportional to the foil speed. Thus, the tin thickness places a lower limit on the substrate speed in the tin dip, which, as an example, is about thirteen centimeters per second for a tin bath at 900°–1000° C.

Subsequently, after the tin coating is applied, the niobium substrate is cooled before being treated with a reaction anneal to react the tin coating and the niobium base metal. During this final anneal, a layer of superconducting triniobium tin is formed on both sides of the niobium substrate. In the reaction anneal, the foil is moved through a furnace at about 1050° C. and the speed of the foil depends on the anneal time and the height of the furnace. For instance, in a five meter furnace for about two hundred seconds at 1050° C., the foil speed is about 2.5 centimeters per second.

During the reaction anneal step, as the tin-coated foil is passed through a vertical furnace in an inert atmosphere, the tin-alloy coating becomes molten and reacts with the niobium substrate to form the superconducting intermetallic, triniobium tin. However, during the reaction the tin will often flow creating tin-depleted regions, areas of exposed triniobium tin, and regions of tin "rivers" or tin "balls". As a result, the depletion of tin on the substrate limits the growth of triniobium tin and subsequently limits the critical current density that can be achieved by the superconductor. Additionally, solder will not wet the exposed triniobium tin surface interface to provide an adequate bond to the copper during subsequent lamination processes. Also, the non-uniform surface condition of the triniobium tin superconductor after the reaction anneal, will create stress concentrators which will fracture the superconducting layer, thus rendering the superconductor useless.

Thus, there is a need for a method to form a continuous triniobium tin superconductor with a uniform surface coating of tin alloy during and after reaction anneal.

SUMMARY OF THE INVENTION

This invention satisfies the need by providing a process for making triniobium tin superconductor by solid-liquid diffusion that stabilizes the tin flow during reaction anneal by employing an oxidation layer on the tin alloy coat in an effective amount. A surface oxide is utilized on the tin alloy surface to increase the surface tension of the molten tin alloy during the reaction anneal step. Also, the oxide layer further promotes a triniobium tin surface after the reaction anneal which is smoothly and uniformly coated. An effective amount of oxide on the tin alloy layer is an amount that stabilizes the tin flow on the niobium substrate during the reaction anneal. The oxidizing methods employed to form the oxide layer on the tin coating are performed for a period of time sufficient to form the effective oxide layer.

The tin alloy comprises a tin-copper coating obtained from the tin bath. Generally, the alloy is about 10 weight percent copper and balance substantially tin. Up to about thirty weight percent copper may be present in the tin alloy.

In this invention the term "reaction anneal" means the reaction between the tin alloy and the niobium during an anneal treatment in a furnace at about 1050° C. to form the triniobium tin superconductor. It is during this manufacturing step, that the tin alloy becomes molten in the vertical furnace and flows downward along the niobium substrate leaving bare spots of the triniobium tin, non-wet areas, and balls and rivulets of tin along the niobium substrate surface.

Therefore, this invention also provides a method to uniformly and smoothly coat the niobium substrate with tin during the reaction anneal which comprises oxidizing the tin alloy coated surface after the tin dip to form an oxide layer on the tin alloy coating.

DESCRIPTION OF THE INVENTION

Figure 1:
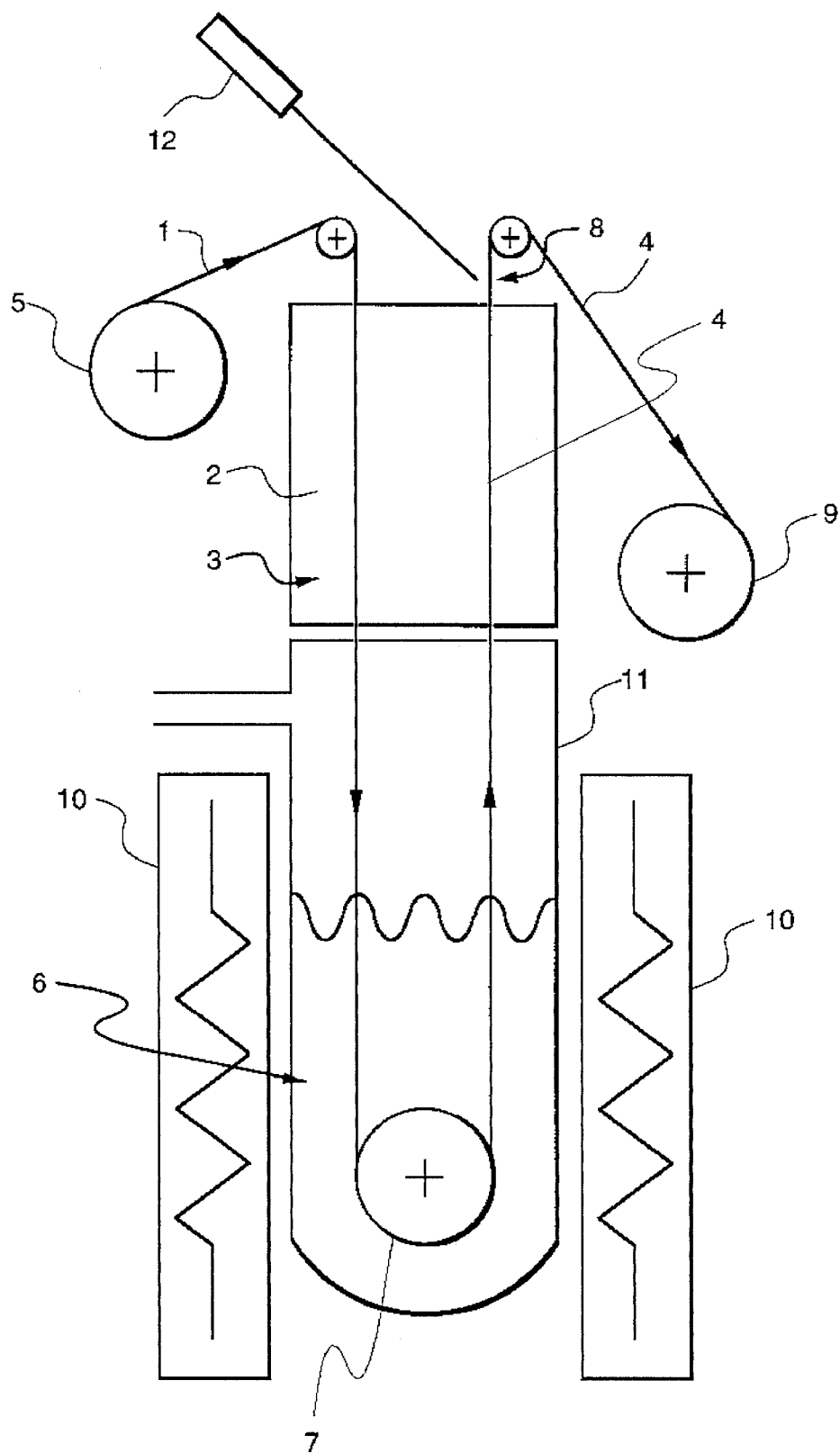
FIG. 1 shows an embodiment of the invention in which the tin alloy coated surface is oxidized as the foil exits the tin dip by either adding oxygen to the cooling gas or monitoring the foil exit temperature as it enters the room atmosphere.

The quality and uniformity of triniobium tin superconductor tape is improved by adding an oxide layer or oxide film to the tin alloy surface during the manufacture of the superconductor. The oxide layer is added after the tin dip step in the solid-liquid diffusion method of forming triniobium tin superconductor. The oxide layer, also referred to as an oxide film, can be added to the surface of the tin alloy coat in at least four different ways.

By creating a surface oxide layer on the tin alloy, the tin balls and rivulets tend not to form during reaction anneal so that the triniobium tin superconductor is less susceptible to fracture in post processing steps and has increased current density.

The niobium substrate can be pure niobium or a niobium-based alloy, such as niobium-one weight percent zirconium. This substrate generally takes the form of a wire or foil. However, any niobium or niobium-based substrate that undergoes the manufacturing steps by solid-liquid diffusion to form triniobium tin superconductor can be used. Herein, the term niobium substrate is understood to mean pure niobium or a niobium-based alloy. Also, prior to tin coating the niobium substrate, oxygen is added to the niobium substrate by anodization or other known process and is decomposed so that the niobium substrate contains a controlled amount of oxygen, generally about two weight percent.

The invention is described herein for the manufacture of triniobium tin superconductor foil. The niobium substrate is a foil, with the composition niobium—about 1 weight percent zirconium—about 2 weight percent oxygen. However, it is contemplated that the method of this invention is applicable to other substrate configurations, such as wire, and other niobium alloys with various chemical compositions.

Generally, in the conventional solid-liquid diffusion process, after the niobium foil (niobium—1 weight percent zirconium—about 2 weight percent oxygen) undergoes the tin dip process, the tin alloy (tin—about 10 weight percent copper) coated foil is cooled as it exits the hot tin bath (900°–1100° C.) to below 115° C., and preferably below 100° C., in an inert atmosphere in a cooling tower. The tin alloy coated foil is then rewound on a spool until processing in the reaction anneal furnace. The reaction anneal furnace also is an inert atmosphere and is kept at a temperature of about 1050° C. The inert atmosphere of the cooling tower and the reaction anneal furnace can be argon, helium, nitrogen, other inert gases, or a mixture of inert gases. Usually, no more than about ten parts per million oxygen are present in the inert atmosphere used in the conventional solid-liquid diffusion process. In this invention, the inert atmospheres are adapted to include greater amounts of oxygen, such as about 50–6000 parts per million.

The surface of the tin alloy coated foil can be oxidized during the tin dip operation by either adding oxygen to the cooling gas or monitoring the foil exit temperature as it enters the room atmosphere, while maintaining an appropriate temperature that creates the oxide layer. An embodiment of this is shown in FIG. 1.

Now referring to FIG. 1, a schematic diagram of the tin dip process is shown where oxygen can be added to the atmosphere 3 of the cooling tower 2 to form an oxide film on the tin alloy coating 4, or the exit temperature of the tin alloy foil can be monitored, as the foil leaves the cooling tower 2 and enters the room atmosphere 8. The niobium alloy foil 1 is coiled on a spool 5, herein referred to as a payoff spool, and travels continuously through the tin dip 6 under a smooth backing roller 7. The tin dip 6 is heated to about 900°–1100° C. by a heating means 10. The tin dip 6 is contained in a container such as a quartz crucible 11. From the tin dip 6, the foil, now coated with tin 4, immediately travels through the cooling tower 2 having an atmosphere mixed with oxygen and argon, or helium and oxygen 3. Other inert gases may also be used in place of argon or helium. The cooling tower 2 can contain between about 50–6000 parts per million oxygen. The foil passes through the cooling tower 2 at a rate for a period of time sufficient to allow an effective amount of the oxide layer to form on the tin coating. When the tin coated foil 4 exits the cooling tower 2, the temperature of the foil is about 115° C. or less. An oxide layer forms on the surface of the tin coat as the foil 4 passes through the cooling tower 2 containing oxygen 3. The foil 4 now enters room atmosphere 8. Due to an exit temperature of about 115° C. or less, no further oxide forms on the tin coated foil. The foil 4 is then respooled 9.

As an alternative embodiment of FIG. 1, the niobium foil 1 travels through the tin dip 6, passes through the cooling tower 2 which contains an inert gas, but not oxygen, and then exits the cooling tower 2 into the room atmosphere 8 at a temperature above 115° C. so that a tin oxide forms on the surface of the tin coated foil under room atmosphere conditions containing oxygen. An optical pyrometer 12 is used to monitor the surface temperature of the foil upon exiting from the cooling tower.

Figure 2:
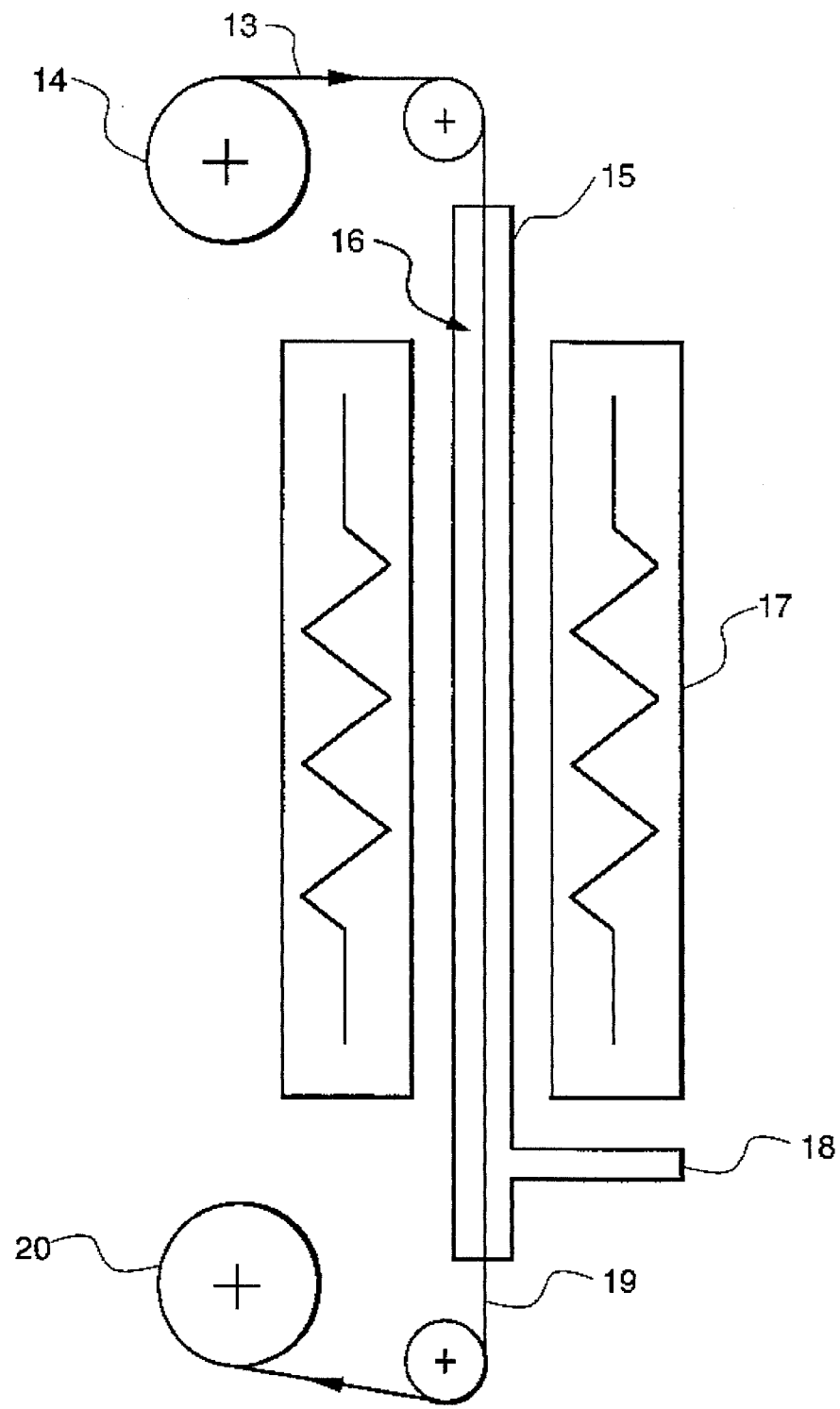
FIG. 2 is an embodiment of the invention in which an intermediate low temperature oxidation step is added after the tin dip and before the reaction anneal step.

FIG. 2 demonstrates an alternate embodiment of the invention where a separate oxidation process step is added before the reaction anneal step. The tin coated foil 13 travels from a payoff spool 14 and enters a chamber 15 containing a mixed oxygen and argon 16 or oxygen and helium atmosphere 16. Other inert gases may also be used in place of argon or helium. Such a chamber 15 can be a quartz tube and is heated by a heating means, such as a resistance furnace 17. The atmosphere 16 of the chamber is monitored 18 for oxygen content in the argon or helium. Generally, the oxygen is present in about 50–6000 parts per million and the chamber is maintained at a temperature above 100° C., with about 500° C. being the preferred temperature. The foil passes through the chamber at a rate for a period of time sufficient to form an effective amount of the oxide layer on the tin coating. After passing through the oxygen-containing chamber 15 the tin coated foil with the oxide layer on the tin surface 19 can be respooled 20 for further processing or can enter the conventional reaction anneal step.

Figure 3:
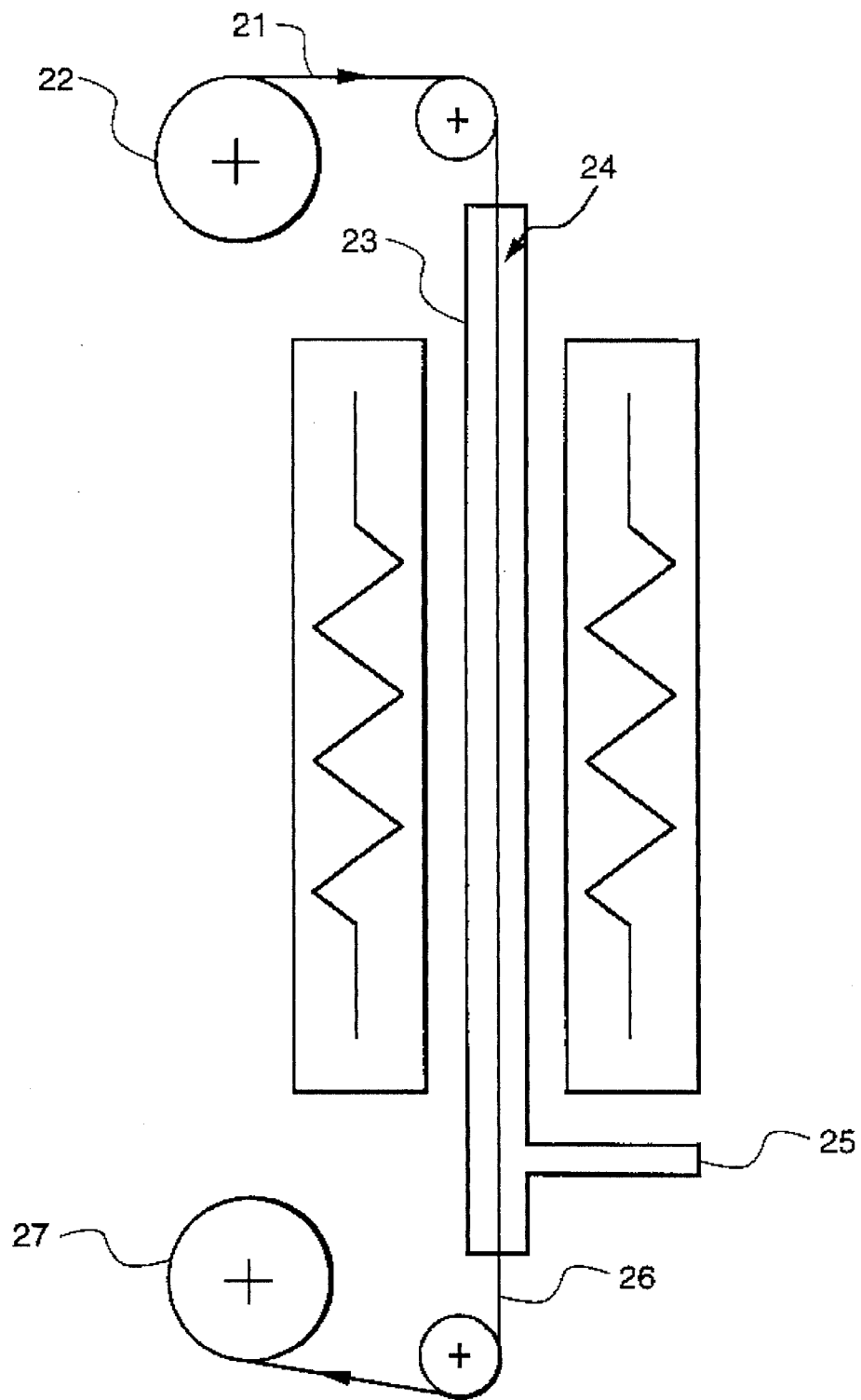
FIG. 3 shows a third embodiment of the invention where the reaction anneal furnace atmosphere is oxygenated by adding a controlled amount of oxygen to the inert atmosphere.

FIG. 3 further demonstrates another embodiment of the invention where oxygen can be added to the tin coat during the reaction anneal step. The tin coated foil 21 travels from the payoff spool 22 into the reaction anneal furnace 23 and passes at about 1050° C. through an atmosphere 24 in the furnace 23 containing about 50–6000 parts per million oxygen in argon or helium. Here again, other inert gases may be used in place of argon or helium. The oxygen content in the furnace 23 is monitored 25. While traveling through the furnace, the tin and the niobium react to form the triniobium tin superconductor 26. The triniobium tin foil is then respooled 27. The foil travels at a rate and for a period of time to form the effective amount of the oxide layer on the tin while also forming the triniobium tin superconductor.

The following examples further demonstrate the invention.

EXAMPLES

A section of niobium—about 1 weight percent zirconium—about 2 weight percent oxygen foil was prepared by surface cleaning, surface roughening, anodizing, and decomposition anneal, all methods known by those skilled in the art. The foil was then tin dipped in a tin-10 weight percent copper bath at 1050° C. within an inert atmosphere. The foil exit temperature was monitored using a surface pyrometer and maintained below 115° C. to minimize oxide formation. The following examples utilized this material to demonstrate the invention.

EXAMPLE 1

An added oxidation step prior to the reaction anneal was used as depicted in FIG. 2. The tin coated foil was processed through an oxidizing chamber at 500° C. for thirty seconds with levels of oxygen between 50–6000 parts per million being added to the argon atmosphere in the chamber. The oxygen content in the atmosphere was measured at input ports. The oxygen source was air. Other sources of oxygen can be used, such as pure oxygen, water vapor, and carbon dioxide. The foil was then further reacted in an inert atmosphere at 1050° C. Scanning Auger electron microprobe analysis on the outer 1500 Angstroms of the foil surface after oxidation anneal showed a layer of niobium oxide, $Nb_2O_5$, on the foil surface at each oxidation level tested. The oxidized tin coated foil appeared to have good wetting properties during the reaction anneal step and no tin balls or large areas of exposed triniobium tin were observed on the surface of the foil after the reaction anneal.

EXAMPLE 2

This example demonstrates the addition of oxygen to the reaction anneal furnace, as shown in FIG. 3. There was no pre-oxidation step. The reaction anneal was run at 1050° C. for thirty seconds with about 50–1000 parts per million of oxygen mixed with argon. The oxygen was monitored at an outlet port. Scanning Auger of the foil surface after reaction anneal showed the formation of the following compounds: $Nb_2O_5$, $NbO_2$, $ZrO_2$, $SnO_2$, $Cu_3Sn$, and $Cu_6Sn_5$.

The degree of de-wetting after the reaction anneal was determined qualitatively by the macroscopic appearance of the foil surface. No tin balls or large areas of exposed triniobium tin were observed on the surface of the foil after the reaction anneal. A comparison of the Auger results and the appearance of the foil showed that the oxidation step, which forms a niobium oxide on the foil surface, increases the stability of the flow of the tin alloy during reaction anneal.

EXAMPLE 3

This was a control sample processed by the conventional solid-liquid diffusion process without adding oxygen to the tin coated foil before or during the reaction anneal. The foil showed de-wetting and tin balls after reaction anneal.

EXAMPLE 4

Figure 4:
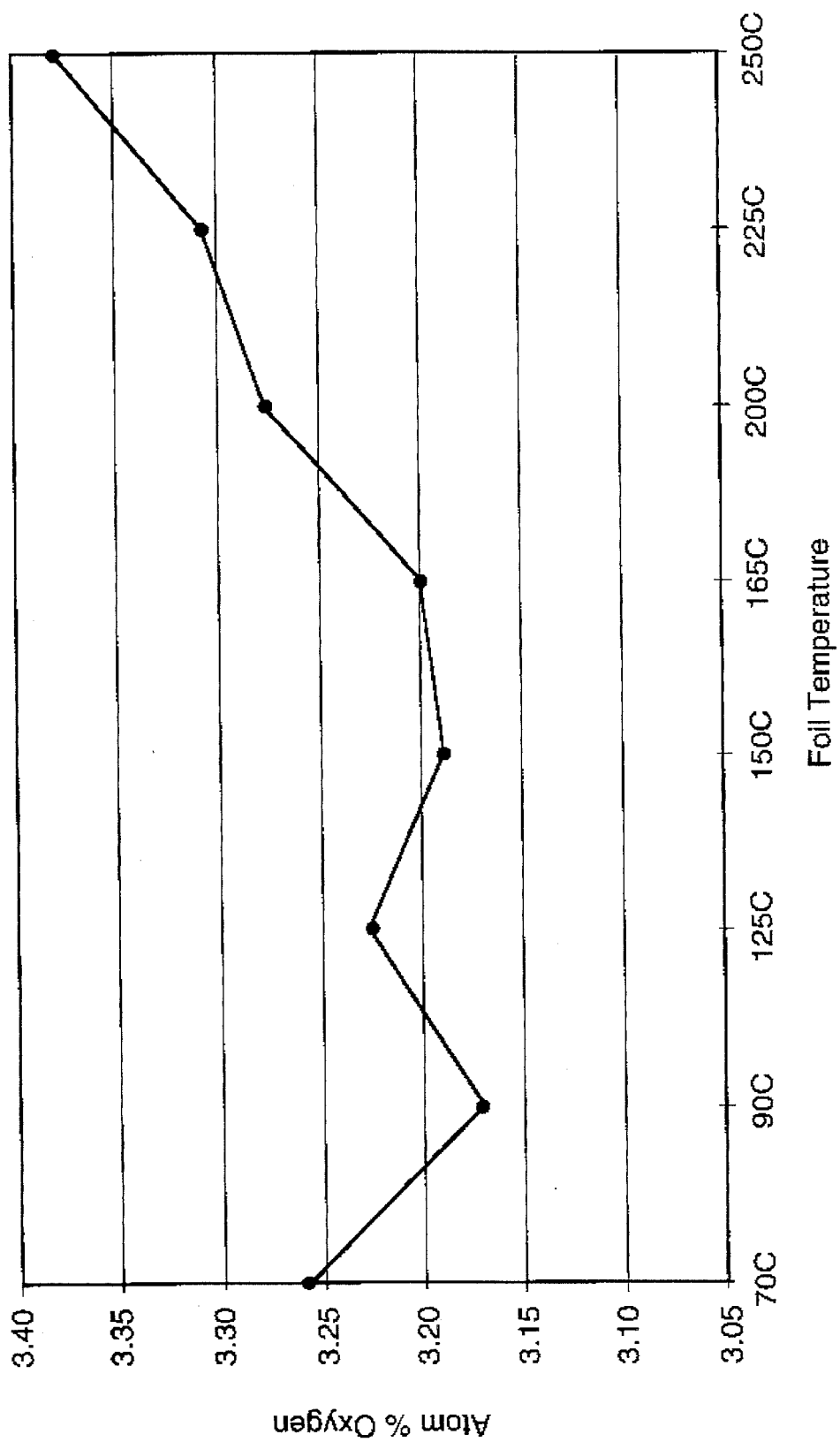
FIG. 4 demonstrates the correlation of increased oxygen content due to the tin coated foil exiting the tin dip above 100° C.

FIG. 4 is a graph depicting the increase of oxygen content after tin dip based on the exit temperature of the tin coated foil above about 115° C.

What is claimed:

1. A process for making triniobium tin superconductors by liquid-solid diffusion comprising: performing a tin dip process on a niobium based substrate to form a tin coating on the substrate, and oxidizing surfaces of the tin coating to form an oxide layer on the tin coating in an amount effective to stabilize tin flow on the niobium based substrate during a reaction anneal.

2. A process according to claim 1 where the tin coating comprises a tin alloy.

3. A process according to claim 2 where the tin alloy comprises tin and copper.

4. A process according to claim 3 where the tin copper alloy comprises tin-10 weight percent copper.

5. A process according to claim 1 where the niobium based substrate comprises a niobium-one weight percent zirconium-two weight percent oxygen substrate.

6. A process according to claim 1 where the substrate is a wire or a foil.

7. A process according to claim 1 where the oxidizing of the surface of the tin coating comprises passing the tin coated substrate through a cooling tower containing between about 50–6000 parts per million oxygen in an inert gas immediately after exiting a tin dip, for a sufficient amount of time to form the effective amount of the oxide layer.

8. A process according to claim 1 where the oxidizing of the surface of the tin coating comprises controlling the exit temperature of the tin coated substrate from the tin dip process to above 115° C. in a room atmosphere containing oxygen.

9. A process according to claim 1 where the oxidizing of the surface of the tin coating comprises passing the tin coated substrate through an oxidizing chamber containing between about 50–6000 parts per million oxygen in an inert gas at a temperature greater than 100° C. for a sufficient amount of time to form the effective amount of the oxide layer on the tin coating.

10. A process according to claim 1 where the oxidizing of the surface of the tin coating comprises adding oxygen in an amount between about 50–6000 parts per million to an inert gas in a reaction anneal furnace at 1050° C., and the oxidizing and reaction anneal are performed in said furnace to form a triniobium tin superconductor.

* * * * *